United States Patent
Park et al.

(10) Patent No.: US 7,438,765 B2
(45) Date of Patent: Oct. 21, 2008

(54) ADJUSTABLE SHIELDING PLATE FOR ADJUSTING AN ETCHING AREA OF A SEMICONDUCTOR WAFER AND RELATED APPARATUS AND METHODS

(75) Inventors: Jong-Chul Park, Gyeonggi-do (KR); Sang-sup Jeong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 348 days.

(21) Appl. No.: 11/119,490

(22) Filed: Apr. 29, 2005

(65) Prior Publication Data
US 2005/0263484 A1 Dec. 1, 2005

(30) Foreign Application Priority Data
May 31, 2004 (KR) ............ 10-2004-0038891

(51) Int. Cl.
 B05B 5/025 (2006.01)
 C23C 16/00 (2006.01)
 C23F 1/00 (2006.01)
 H01L 21/306 (2006.01)

(52) U.S. Cl. ............. 118/624; 118/715; 118/723 E; 118/723 R; 156/345.3; 156/345.44; 156/345.45; 156/345.46; 156/345.47

(58) Field of Classification Search ............. 118/624; 156/345.3
See application file for complete search history.

(56) References Cited

U.S. PATENT DOCUMENTS

| 5,945,351 | A | 8/1999 | Mathuni | 438/706 |
| 2002/0102754 | A1* | 8/2002 | Fujimori et al. | 438/22 |
| 2002/0142612 | A1* | 10/2002 | Wu et al. | 438/710 |
| 2002/0162629 | A1* | 11/2002 | Jeon et al. | 156/345.35 |
| 2003/0029567 | A1* | 2/2003 | Dhindsa et al. | 156/345.47 |
| 2005/0173067 | A1* | 8/2005 | Lim | 156/345.32 |

FOREIGN PATENT DOCUMENTS

| JP | 62067171 | * | 3/1987 |
| KR | 1020020029824 | | 4/2002 |
| KR | 1020020080955 | * | 10/2002 |
| KR | 1020030060690 | | 7/2003 |

* cited by examiner

Primary Examiner—Michael Cleveland
Assistant Examiner—Keath T Chen
(74) Attorney, Agent, or Firm—Myers Bigel Sibley & Sajovec

(57) ABSTRACT

An apparatus for adjusting an etching area of a semiconductor wafer includes an adjustable shielding plate. The adjustable shielding plate includes a plurality of shielding members. Each of the plurality of shielding members are movable between a first position configured to shield a portion of a semiconductor wafer from an etching gas and a second position configured to expose an unshielded etching portion of the semiconductor wafer to the etching gas.

15 Claims, 4 Drawing Sheets

ADJUSTABLE SHIELDING PLATE FOR ADJUSTING AN ETCHING AREA OF A SEMICONDUCTOR WAFER AND RELATED APPARATUS AND METHODS

CROSS-REFERENCE TO RELATED APPLICATION

This application claims priority to Korean Patent Application No. 2004-38891 filed on May 31, 2004, the content of which is herein incorporated by reference in its entirety.

BACKGROUND OF THE INVENTION

1. Field of the Invention

The present invention relates to methods and apparatus of fabricating a semiconductor device. More particularly, the present invention relates to methods and apparatus of etching an edge portion of a wafer for fabricating the semiconductor device.

2. Description of the Related Art

As information and telecommunication technology improve, semiconductor technology has been developed to improve the integration degree, reliance and response speed of semiconductor devices. Single crystals of silicon may be formed on a silicon substrate, such as a silicon wafer, and various layers may be formed on the substrate. The various layers can be formed into patterns having desired electrical characteristics.

Fabrication processes for the semiconductor devices can include one or more of the following: a deposition process, a photolithography process, an etching process, an ion implantation process, a polishing process and the like. Some processes may be performed sequentially to form the device. After one of the processes is completed on a wafer, various byproduct materials, for example, a metallic polymer and/or polysilicon, can be deposited and can remain on the edge portion of the wafer.

The byproducts on the edge portion of the wafer can function as a particle source, and therefore the yield at the edge portion of the wafer (or over the entire surface) of the wafer may be reduced. Accordingly, it may be advantageous to remove some or all of the byproducts.

Conventionally, the edge portion of the wafer was partially exposed, and a wet etching process was performed on the exposed edge portion of the wafer to remove or reduce the byproducts on the wafer. However, wet etching may result in difficulties in process controls and high processing costs because of the etchant(s) used and the relatively long operational time that may be needed to reduce or remove the byproducts.

The byproducts on the edge portion of semiconductor wafers may also be removed through a dry etching process. For example, U.S. Pat. No. 5,945,351 (issued to Josef Mathuni, et al.) proposes an apparatus and method of dry etching an edge portion of the wafer.

FIG. 1 is a cross-sectional view illustrating a conventional etching apparatus for removing an edge portion of a wafer.

Referring to FIG. 1, a conventional etching apparatus includes a chamber 10 into which an etching gas and an inert gas are supplied, a chuck 20 positioned in the chamber 10 to support a wafer W, a lower electrode 40 positioned along an edge portion of the chuck 20 and to which a high frequency voltage is applied, a gas dispersion plate 30 positioned over the wafer W for dispersing the inert gas to uniformly supply the inert gas onto a central portion of a top surface of the wafer, and an upper electrode 50 positioned over the wafer W opposite the lower electrode 40.

The gas dispersion plate 30 includes an insulation material and is positioned adjacent to the top surface of the wafer W. In this configuration, an edge portion of the wafer W is defined by the gas dispersion plate 30. That is, a lateral portion of the wafer W that is not covered with the gas dispersion plate 30 is etched away during the edge etching process.

The apparatus of FIG. 1 can be used to dry etch the edge portion of the wafer, and, in comparison with a wet etching process, the dry etching process can be relatively simple and the operation time for reducing or removing the byproducts on the edge portion of the wafer W can be relatively short.

However, it may be difficult to adjust the etching area of the edge portion of the wafer using the dry etching process described above. The etching area is defined by the gas dispersion plate 30. However, the gas dispersion plate 30 may be difficult, costly and/or time consuming to change. It may be desirable to vary the etching area of the edge portion of the wafer W based on differences in processing techniques and environments. Therefore, the etching area defined by the gas dispersion plate 30 may reduce the usable area of the wafer.

SUMMARY OF THE INVENTION

According to embodiments of the present invention, an apparatus for adjusting an etching area of a semiconductor wafer in an etching process includes an adjustable shielding plate. The adjustable shielding plate includes a plurality of shielding members. Each of the plurality of shielding members is movable between a first position configured to shield a portion of a semiconductor wafer from an etching gas and a second position configured to expose an unshielded etching portion of the semiconductor wafer to the etching gas.

According to further embodiments of the present invention, an apparatus for etching a portion of a wafer includes a semiconductor processing chamber, a chuck positioned in the chamber and configured to support the wafer, a gas supplier configured to supply an etching gas for etching at least a portion of the wafer in the chamber, and an adjustable shielding plate. The adjustable shielding plate includes a plurality of shielding members. Each of the plurality of shielding members is movable between a first position configured to shield a portion of a semiconductor wafer from an etching gas and a second position configured to expose an unshielded etching portion of the semiconductor wafer to the etching gas.

According to further embodiments of the present invention, methods of etching an edge portion of a wafer with an adjustable shielding plate including a plurality of shielding members are provided. The plurality of shielding members is positioned in one of a first position configured to shield a portion of a semiconductor wafer from an etching process and a second position configured to expose an unshielded etching portion of the semiconductor wafer.

Further features, advantages and details of the present invention will be appreciated by those of ordinary skill in the art from a reading of the figures and the detailed description of the embodiments that follow, such description being merely illustrative of the present invention.

BRIEF DESCRIPTION OF THE DRAWINGS

The above and other features and advantages of the present invention will become readily apparent by reference to the following detailed description when considering in conjunction with the accompanying drawings, in which.

DETAILED DESCRIPTION OF EMBODIMENTS ACCORDING TO THE INVENTION

Figure 1:
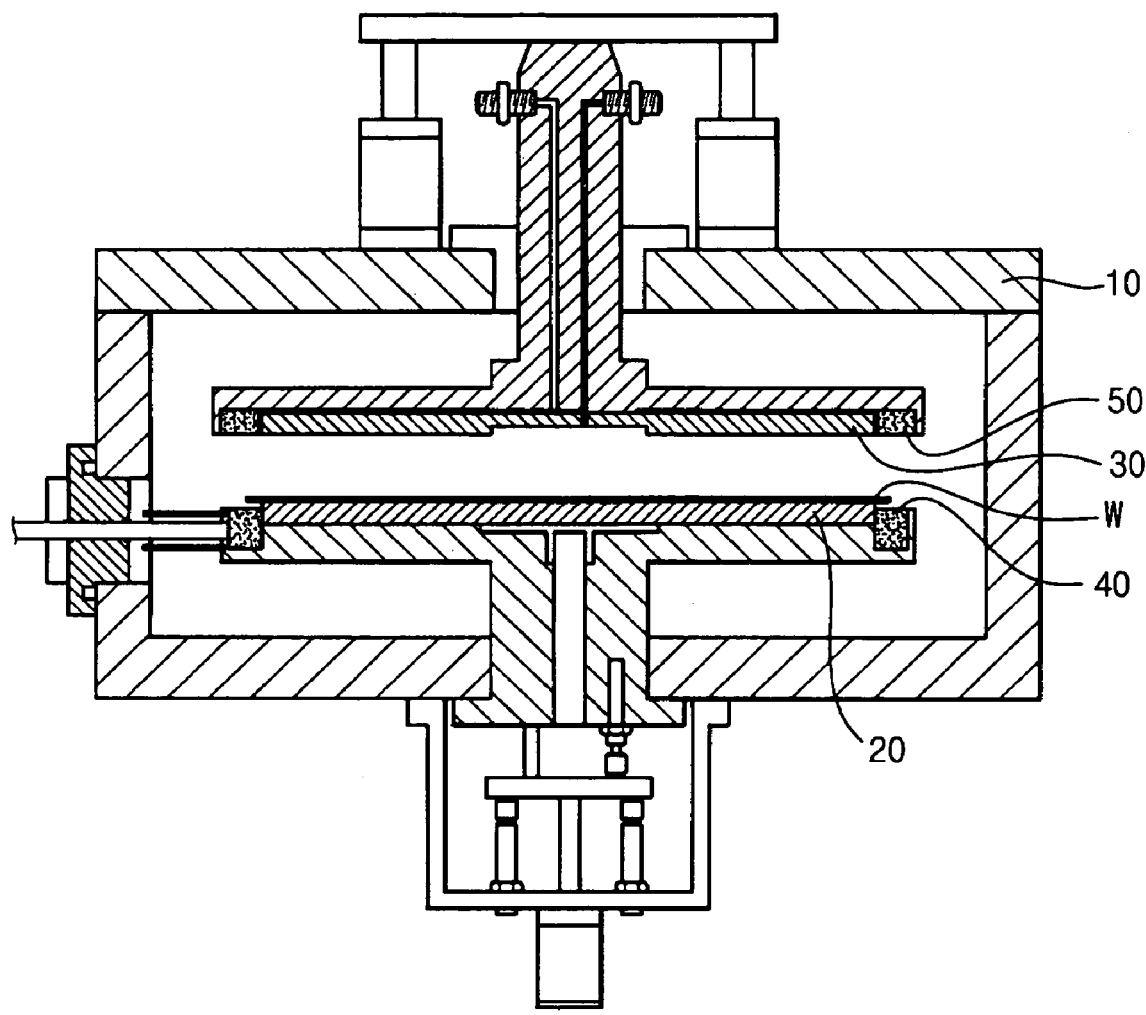
FIG. 1 is a cross-sectional view illustrating a conventional etching apparatus for removing an edge portion of a wafer.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a "first" element, component, region, layer or section discussed below could also be termed a "second" element, component, region, layer or section without departing from the teachings of the present invention. The sequence of operations (or steps) is not limited to the order presented in the claims or figures unless specifically indicated otherwise.

Figure 2:
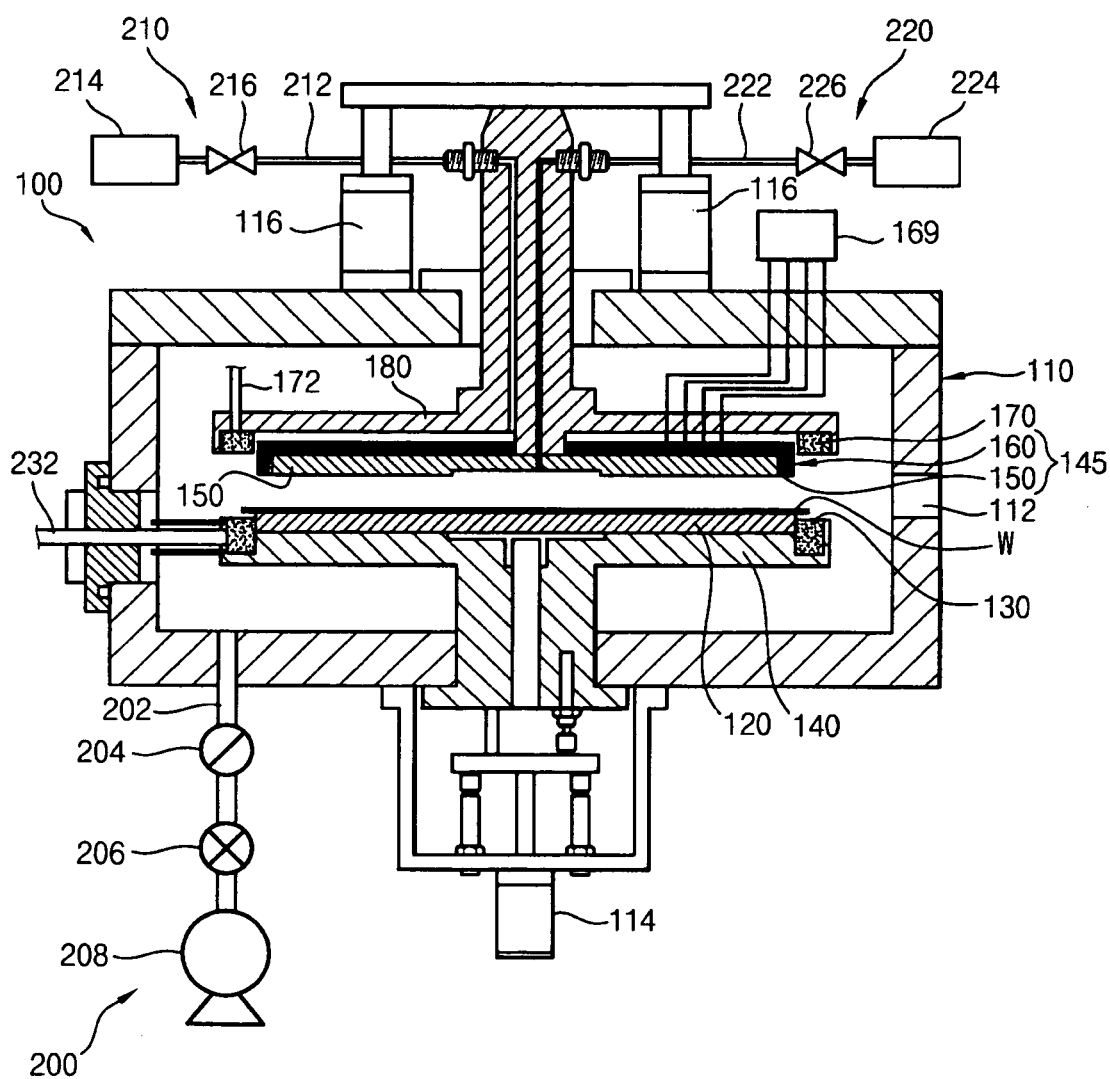
FIG. 2 is a cross-sectional view illustrating an apparatus for etching an edge portion of a wafer according to embodiments of the present invention.

FIG. 2 is a cross-sectional view illustrating an apparatus for etching an edge portion of a wafer (hereinafter, referred to as wafer edge apparatus) according to an exemplary embodiment of the present invention.

Referring to FIG. 2, the wafer edge apparatus 100 includes a chamber 110, a chuck 120, a lower electrode 130, an adjustable shielding plate 145, a driving member 169, an upper electrode 170, an etching gas supplier 210, a stopping gas supplier 220 and a discharging member 200. The shielding plate 145 includes a primary shielding plate 150 and shielding members 160.

The chamber 110 provides a vacuum in a region in which an etching process is performed. An opening 112 is positioned at one side portion of the chamber 110 for moving a wafer W to/from the chamber 110.

The etching gas supplier 210 is positioned over the chamber 110 and configured to supply an etching gas that etches the edge portion of the wafer W. The etching gas supplier 210 includes a first line 212 into the chamber 110, a first gas reservoir 214 connected to an end portion of the first line 212 and containing an etching gas, and a first valve 216 positioned on the first line 212 for controlling the etching gas. The etching gas flows through the first line 212 to the edge portion of the wafer W.

The etching gas may be selected in accordance with the layer formed on the edge portion of the wafer W. The etching gas can be any suitable etching gas, for example, a fluorine-based gas such as a carbon tetrafluoride (CF4) gas, a sulfur hexafluoride (SF6) gas and/or a nitrogen trifluoride (NF3) gas. The gas reservoir 214 contains the etching gas at a suitable pressure, and the etching gas flows into the first line 212 when the first valve 216 is opened.

A stopping gas supplier 220 is also positioned over the chamber 110 for supplying a stopping gas to a central portion of the wafer W. The stopping gas supplier 220 includes a second line 222 into the chamber 110, a second gas reservoir 214 connected to an end portion of the second line 222 and containing the stopping gas, and a second valve 226 positioned on the second line 222 for controlling the flow of the stopping gas. The stopping gas flows through the second line 222 to the central portion of the wafer W.

The stopping gas can include an inert gas, such as an argon (Ar) gas, a helium (He) gas, a nitrogen (N2) gas and/or a mixture thereof. The second gas reservoir 224 contains the stopping gas at a predetermined pressure, and the stopping gas flows into the second line 222 when the second valve 226 is opened. The stopping gas can be supplied to the central portion of the wafer W positioned on the chuck 120 at a pressure that can be higher than the etching gas supplied through the first line 212, and thus the etching gas can be substantially prevented from flowing into the central portion of the wafer W. In addition, byproducts of the etching process on the edge portion of the wafer W may also be substantially prevented from being supplied to the central portion of the wafer W due to the higher pressure of the stopping gas.

The discharging member 200 is arranged under the chamber 110 for discharging the byproducts of the etching process and/or residual etching gas that has not reacted during the etching process from the chamber 110. As illustrated, the discharging member 200 includes a vacuum pump 208, a vacuum line 202, a throttle valve 204 and a gate valve 206.

The vacuum pump 208 maintains a vacuum in the space in the chamber 110, and provides a vacuum force for discharging the byproducts and/or the residual etching gas from the chamber 110. The vacuum line 202 connects the chamber 110 with the vacuum pump 208. The throttle valve 204 is positioned on the vacuum line 202 to control the vacuum state in the chamber 110. The gate valve 206 is opened/closed in accordance with the operation of the vacuum pump 208.

The chuck 120 is positioned in the chamber 110 and supports the wafer W inputted through the opening 112. As illustrated, the chuck 120 is an electrostatic chuck that supports the wafer W by using an electrostatic force.

A lower insulator 140 is positioned beneath the chuck 120 and is larger in size than the chuck, so that the lower insulator 140 extends over a side boundary of the chuck 120. For example, the lower insulator 140 can include ceramic or quartz.

A lower cylinder 114 is installed under the chamber 110 and is connected to the lower insulator 140 to drive the chuck 120 and the lower insulator 140.

A lower electrode 130 is positioned on side surfaces of the chuck 120 and the lower insulator 140. The lower electrode 130 is formed into a ring shape, and a high frequency voltage is applied to the lower electrode 130 through a high frequency output terminal 132.

The shielding plate 150 is disc-shaped and generally corresponds to the wafer W. The shielding plate 150 shields the central portion of the wafer W, which does not include the edge portion thereof, so that the central portion of the wafer W is prevented from being etched during the etching process on the edge portion of the wafer W. As illustrated, the shielding plate 150 is positioned close to a top surface of the wafer W without making contact with the top surface of the wafer W.

In particular embodiments, a plurality of holes may be formed on the surface of the shielding plate 150 that faces to the top surface of the wafer W. The stopping gas may be uniformly distributed on the top surface of the wafer W through the holes from the second gas reservoir 220 via the second line 222.

The shielding plate 150 can include an insulation material so as to block the power supplied from a power source. Examples of suitable insulation materials include ceramic, quartz, and the like.

Figure 3:
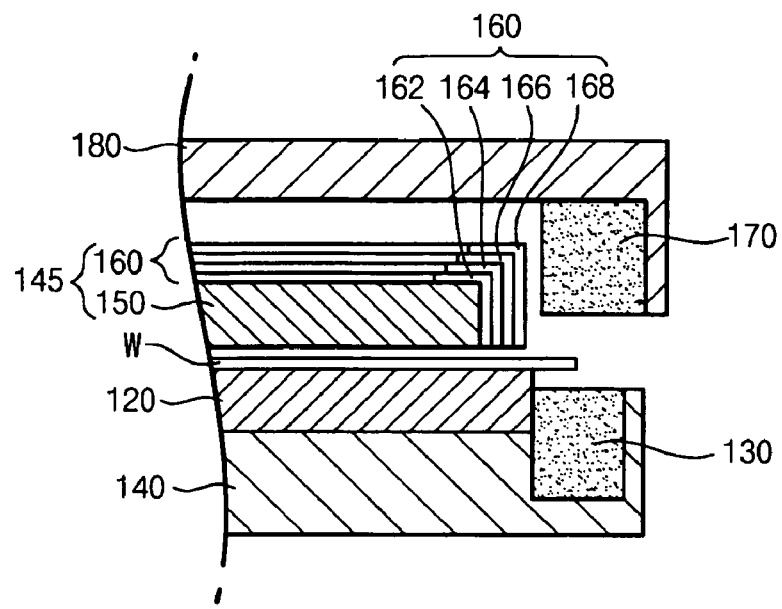
FIGS. 3 and 4 are enlarged cross-sectional views illustrating the shielding members shown in FIG. 2.

FIG. 3 is a cross-sectional view illustrating the shielding members shown in FIG. 2.

Referring to FIG. 3, the adjustable shielding plate 145, which includes the primary plate 150 and the shielding members 160 is shown. The shielding members 160 include four rings 162, 164, 166, and 168. The first, second, third and fourth rings 162, 164, 166, and 168 each have a different diameter. The first, second, third and fourth rings 162, 164, 166, and 168 are sequentially arranged in a radial direction of the wafer W, so that the rings 162, 164, 166, and 168 are sequentially stacked from the first ring 162 (i.e., the innermost ring) to the fourth ring 168 (i.e., the outermost ring) along the radial direction of the wafer W. That is, the first ring 162 has the smallest diameter, and the diameters of the second, third and fourth rings 164, 166, and 168 are increased in the order named, so that the fourth ring 168 has the largest diameter. The inner diameter of the first ring 162 is essentially the same as that of the primary shielding plate 150, and the outer diameter of the first ring 162 is the same as the inner diameter of the second ring 164. In the same way, the outer diameter of the second ring 164 is the same as the inner diameter of the third ring 166, and the outer diameter of the third ring 166 is the same as the inner diameter of the fourth ring 168. Accordingly, rings having a smaller diameter are generally inserted inside rings having a large diameter.

When the shielding members 160 are most adjacent to the wafer W without making contact with the top surface of the wafer W, the first ring 162 makes close contact with a side surface of the shielding plate 150, and the second ring 164 makes close contact with an outer side surface of the first ring 162. In the same way, the third ring 166 makes close contact with an outer side surface of the second ring 164, and the fourth ring 168 makes close contact with an outer side surface of the third ring 166.

Each of the first, second, third and fourth rings 162, 164, 166, and 168 is configured to individually move upwardly or downwardly in a direction perpendicular to a surface of the wafer W to adjust the etching area of the edge portion of the wafer W. In this configuration, the etching area of an edge portion of a wafer W may be adjusted using the shielding members 160 (and the first, second, third and fourth rings 162, 164, 166, and 168), and thus the edge portion of the wafer W may be sufficiently etched regardless of the edge size of the wafer W. In addition, the etching area may be more rapidly adjusted when compared with a conventional etching apparatus to thereby improve productivity of a semiconductor manufacturing process.

Although the above exemplary embodiments have been described with respect to the disc-shaped adjustable shielding plate 145, the primary plate 150 and rings 160, any suitable shape could be utilized in conjunction with or in place of the disc/ring configuration so that the central portion of the wafer W is sufficiently shielded from the etching gas during the etching process, as would be understood by one of ordinary skill in the art.

Figure 4:
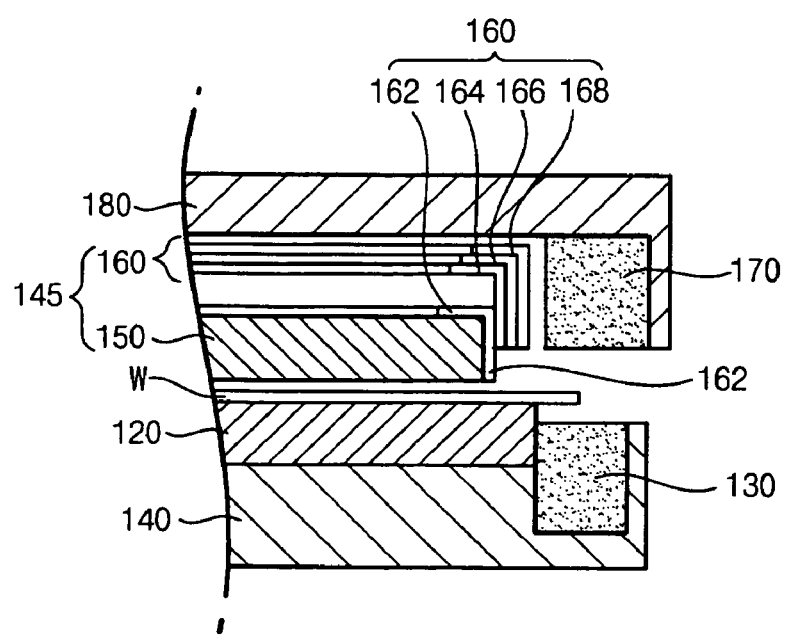

As shown in FIGS. 3 and 4, the first, second, third and fourth rings 162, 164, 166, and 168 are movable between a position configured to shield a portion of the wafer W from the etching process and another position configured to expose an unshielded etching portion of the wafer W.

As shown in FIG. 3, when the shielding members 160 are adjacent to the wafer W without making contact with the top surface of the wafer W, the bottom surfaces of all the rings, which are facing the top surface of the wafer W, have the same height from the top surface of the wafer W, and are coplanar with a lower surface of the shielding plate 150. The edge portion of the wafer W is most widely covered with all of the first, second, third and fourth rings 162, 164, 166, and 168, and thus the etching area of the edge portion is reduced.

For example, as shown in FIG. 4, each of the second, and third and fourth rings 164, 166, and 168 moves upwardly along the direction perpendicular to the surface of the wafer W to provide an etching area on the edge portion of the wafer W that is larger than the etching area shown in FIG. 3. The first ring 162 may also be moved upwardly along the direction perpendicular to the surface of the wafer W to further increase the etching area on the edge portion of the wafer W.

The first, second, third and fourth rings 162, 164, 166, and 168 can move upwardly in the reverse order named. For example, if the fourth ring 168 is moved upwardly with respect to the shielding plate 150, then the etching area of the edge portion is increased with respect to the configuration in FIG. 3. The third and fourth rings 166 and 168 can be moved upwardly with respect to the shielding plate 150 to provide a larger etching area than when only the fourth ring 168 is moved, and so forth to adjust the etching area. Accordingly, when the first, second, third and fourth rings 162, 164, 166, and 168 move upwardly with respect to the shielding plate 150 one by one along the direction perpendicular to the surface of the wafer W, the edge portion of the wafer W is uncovered and the etching area of the edge portion of the wafer W is enlarged by the area previously covered by each ring.

When all of the first, second, third and fourth rings 162, 164, 166, and 168 are moved upwardly along the direction perpendicular to the surface of the wafer W, bottom surfaces of the first, second, third, and fourth rings 162, 164, 166, and 168 generally have the same height from the top surface of the wafer W, and are coplanar with a lower surface of the upper electrode 170. When the first, second, third, and fourth rings 162, 164, 166, and 168 are moved upwardly and away from the wafer W, the edge portion of the wafer W is exposed under each of the first, second, third, and fourth rings 162, 164, 166, and 168, and thus the etching area is increased.

When all of the first, second, third and fourth rings 162, 164, 166, and 168 move downwardly along the direction penetrating the surface of the wafer W, bottom surfaces of the rings have the same height from the top surface of the wafer W, and are again coplanar with a lower surface of the shielding plate 150. The edge portion of the wafer W is again most widely covered with all of the first, second, third and fourth rings 162, 164, 166, and 168, and thus the etching area is reduced.

The shielding plate 150 and/or the shielding members 160 can include an insulation material so as to block a power supplied from a power source, and examples of the insulation material also include ceramic, quartz, and the like.

A width of each ring is determined in accordance with processing environments. For example, the width of the rings may be about 5 mm.

Although the shielding members 160 are illustrated as including four rings, the number of rings may be varied in view of processing environments such as a ring width and a size of the edge portion, as would be understood by one of ordinary skill in the art. In addition, although embodiments according to the invention are illustrated with respect to shielding members that include a plurality of disc-shaped rings that are sequentially stacked from an inner ring to an outer ring along the radial direction of the wafer W, it should be understood that other configurations can be used. For example, a plurality of hollow cylinders having a different diameter from each other may also be used as the shielding members. The cylinders can be sequentially stacked from an inner cylinder to an outer cylinder along the radial direction of the wafer W, as would be understood by those of ordinary skill in the art.

The driving member 169 is connected to each of the first, second, third and fourth rings 162, 164, 166, 168, and thus the rings may individually move up and down along the direction penetrating the surface of the wafer W.

An upper insulator 180 is positioned over a shielding plate 150 and the shielding members 160 and has a sufficient size to cover the shielding members 160. In addition, the upper insulator 180 penetrates the shielding members 160 at a central portion thereof, and thus a central portion of the shielding plate 150 is connected to the upper insulator 180. That is, the shielding plate 150 is supported and fixed by the upper insulator 180. The upper insulator 180 is spaced apart by an intervening distance from the top surface of the shielding members 160 except for a portion thereof to which the shielding plate 150 is connected. The intervening distance is sufficient so that each of the rings 162, 164, 166, 168 does not make contact with the upper insulator 180 when moving upwardly to expose the area of the wafer beneath the respective one of the rings 162, 164, 166, 168. The upper insulator 180 can include ceramic or quartz.

The first line 212 passes through the upper insulator 180 and is connected to a space between the upper insulator 180 and the shielding members 160 so that the etching gas is supplied to the edge portion of the wafer W.

The second line 222 passes through the central portions of the upper insulator 180 and the shielding plate 150 so that the stopping gas is supplied to the central portion of the wafer W.

The upper electrode 170 is laterally positioned on a lower surface of the upper insulator 180 correspondently to the lower electrode 130. A ground line 172 may be connected to the upper electrode 170.

An upper cylinder 116 is installed over the chamber 110 and is connected to the upper insulator 180. The upper cylinder 116 drives the upper insulator 180, the shielding plate 150, the shielding members 160 and the upper electrode 170 upwardly or downwardly along the direction penetrating the surface of the wafer W.

Figure 5:
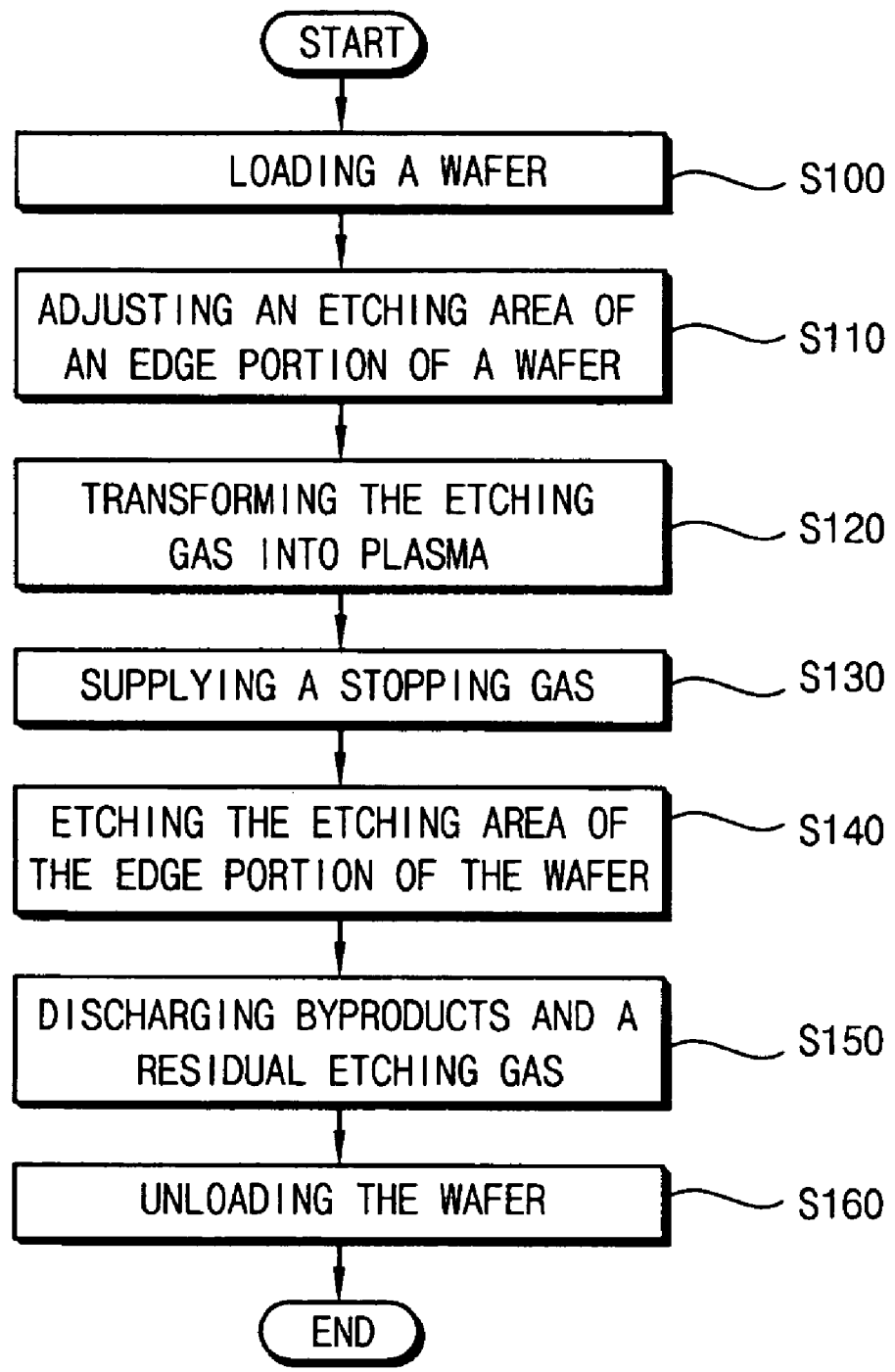
FIG. 5 is a flow chart illustrating methods of etching the edge portion of the wafer according to embodiments of the present invention.

FIG. 5 is a flow chart illustrating operations according to embodiments of the present invention. The operations are described with reference to FIGS. 2 to 5; however, it should be understood that operations according to embodiments of the present invention may be carried out with any suitable processing apparatus.

Referring to FIGS. 2 to 5, a wafer W is loaded on the chuck 120 through the opening 112 of the chamber 110 (step S100). The lower cylinder 214 may move the chuck 120 up and down in the chamber 110 to facilitate loading of the wafer.

The upper cylinder 116 moves the shielding plate 150 and the shielding members 160 downwardly to a position adjacent to the top surface of the wafer W. Each of the rings 162, 164, 166, 168 is sequentially and individually driven, and thus the etching area is adjusted based on the area of the edge portion to be etched. For example, to increase the edge portion of the wafer W, the rings 162, 164, 166, 168 are sequentially and individually driven upwardly from the outer ring to the inner ring along the direction perpendicular to the top surface of the wafer W. Accordingly, the etching area of the edge portion of the wafer W is increased when each of the rings sequentially moves upwardly from the outer ring to the inner ring. In contrast, to reduce the edge portion of the wafer W, the rings 162, 164, 166, 168 are sequentially and individually driven downwardly from the inner ring to the outer ring along the direction perpendicular to the top surface of the wafer W. Accordingly, the etching area of the edge portion of the wafer W is decreased when each of the rings sequentially moves downwardly from the inner ring to the outer ring as shown in FIG. 3. Therefore, the etching area of the edge portion of the wafer W can be adjusted in accordance with an edge portion of the wafer by moving the shielding members between a position configured to shield a portion of the wafer W and a position configured to expose an unshielded etching portion of the wafer W (step S110).

Then, the etching gas supplied from the first gas reservoir 210 is transformed into plasma by applying the high frequency voltage between the upper and lower electrodes 170 and 130 (step S120).

A buffer or stopping gas is supplied to the central portion of the wafer W for preventing the etching gas and byproducts generated from the edge portion from flowing into the central portion of the wafer W (step S130). The stopping gas is supplied at a pressure higher than the etching gas.

The plasma etches in the etching area defined by the shielding members 160 (step S140), and byproducts of the etching process and residual etching gas are discharged from the chamber 110 by the vacuum pump 208 of the discharging member 200 (step S150).

When the discharging member 200 discharges the byproducts and the residual etching gas from the chamber 110, the upper cylinder 116 moves the shielding plate 150 and the shielding members 160 upwardly along the direction perpendicular to the top surface of the wafer. Then, a transfer arm (not shown) holds the etched wafer and the lower cylinder moves the chuck 120 downwardly in the chamber 110. The transfer arm unloads the etched wafer from the chamber 110 through the opening 112 (step S116).

According to embodiments of the present invention, the etching area of an edge portion of a wafer can be adjusted using the shielding members, and thus the edge portion of the wafer may be sufficiently etched away regardless of the edge size of the wafer. In addition, the etching area may be adjusted as compared with a conventional etching apparatus to improve productivity of the semiconductor manufacturing process.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

The invention claimed is:

1. An apparatus for adjusting an etching edge area of a semiconductor wafer in an etching process, the apparatus comprising:

an adjustable shielding plate comprising a plurality of shielding members configured to shield adjacent an edge of the wafer, each of the plurality of shielding members being movable between a first position configured to shield a portion of a semiconductor wafer from an etching gas and a second position configured to expose an unshielded etching portion of the semiconductor wafer to the etching gas, wherein the shielding members comprise an insulation material, a driving member connected to the adjustable shielding plate, the driving member configured to move the plurality of shielding members between the first position and the second position;

wherein the plurality of shielding members includes a plurality of rings having different diameters from each other, the rings being sequentially arranged from an innermost ring to an outermost ring along the radial direction of the wafer, wherein the driving member independently moves each of the rings in a direction perpendicular to a surface of the wafer to adjust an area of the etching portion adjacent the edge of the wafer to shield the central portion of the wafer so that a center portion of the wafer is prevented from etching, wherein one of the shielding members comprises a primary plate positioned in an interior area of the innermost ring and the primary plate is configured to shield the central portion of the wafer.

2. The apparatus of claim 1, wherein one of the shielding members comprises a primary plate positioned in an interior area of the innermost ring, the primary plate configured to shield a central portion of the wafer.

3. The apparatus of claim 1, wherein the insulation material includes ceramic or quartz.

4. The apparatus of claim 1, wherein the adjustable shielding plate is configured to prevent a central portion of the semiconductor wafer from being etched.

5. The apparatus of claim 1, wherein the adjustable shielding plate comprises a disc-shape that generally corresponds to a major surface of the semiconductor wafer.

6. The apparatus of claim 1, wherein the adjustable shielding plate is configured to overlie a center portion of the semiconductor wafer.

7. An apparatus for etching an edge portion of a wafer, comprising:

a semiconductor processing chamber;

a chuck positioned in the chamber and configured to support the wafer;

a gas supplier configured to supply an etching gas for etching at least a portion of the wafer in the chamber; and an adjustable shielding plate comprising a plurality of shielding members configured to shield adjacent an edge of the wafer, each of the plurality of shielding members being movable between a first position configured to shield a portion of a semiconductor wafer from an etching gas and a second position configured to expose an unshielded etching portion of the semiconductor wafer to the etching gas, wherein the shielding members comprise an insulation material, a driving member connected to the adjustable shielding plate, the driving member configured to move the plurality of shielding members between the first position and the second position;

wherein the plurality of shielding members includes a plurality of rings having different diameters from each other, the rings being sequentially arranged from an innermost ring to an outermost ring along the radial direction of the wafer, wherein the driving member independently moves each of the rings in a direction perpendicular to a surface of the wafer to adjust an area of the etching portion adjacent the edge of the wafer to shield the central portion of the wafer so that a center portion of the wafer is prevented from etching, wherein one of the shielding members comprises a primary plate positioned in an interior area of the innermost ring and the primary plate is configured to shield the central portion of the wafer.

8. The apparatus of claim 7, wherein the insulation material includes ceramic or quartz.

9. The apparatus of claim 7, further comprising:
a first electrode positioned along a side surface of the chuck and configured so that, when a high frequency voltage is applied to the first electrode, the etching gas is transformed into plasma; and
a second electrode in the processing chamber.

10. The apparatus of claim 7, further comprising an etch stopping gas supplier for supplying a stopping gas that stops the etching gas from flowing into a central portion of the wafer.

11. The apparatus of claim 10, wherein the stopping gas includes an inert gas.

12. The apparatus of claim 10, wherein a stopping gas pressure is higher than an etching gas pressure.

13. The apparatus of claim 7, wherein the adjustable shielding plate is configured to prevent a central portion of the semiconductor wafer from being etched.

14. The apparatus of claim 7, wherein the adjustable shielding plate comprises a disc-shape that generally corresponds to a major surface of the semiconductor wafer.

15. The apparatus of claim 7, wherein the adjustable shielding plate is configured to overlie a center portion of the semiconductor wafer.

* * * * *